(12) United States Patent
Ko et al.

(10) Patent No.: US 9,935,587 B2
(45) Date of Patent: Apr. 3, 2018

(54) HIGH LINEARITY INDUCTORLESS LNA

(71) Applicant: FCI INC, Gyeonggi-do (KR)

(72) Inventors: DongHyun Ko, Gyeonggi-do (KR); Myung Woon Hwang, Gyeonggi-do (KR)

(73) Assignee: FCI INC, Gyeonggi-Do (KR)

( * ) Notice: Subject to any disclaimer, the term of this patent is extended or adjusted under 35 U.S.C. 154(b) by 0 days.

(21) Appl. No.: 15/144,455

(22) Filed: May 2, 2016

(65) Prior Publication Data
US 2017/0244367 A1   Aug. 24, 2017

(30) Foreign Application Priority Data
Feb. 22, 2016 (KR) .................. 10-2016-0020709

(51) Int. Cl.
| | |
|---|---|
| H03F 3/04 | (2006.01) |
| H03F 3/26 | (2006.01) |
| H03F 1/30 | (2006.01) |
| H03F 3/193 | (2006.01) |
| H03F 1/32 | (2006.01) |
| H03F 3/30 | (2006.01) |

(52) U.S. Cl.
CPC ............ *H03F 1/303* (2013.01); *H03F 1/308* (2013.01); *H03F 1/3217* (2013.01); *H03F 3/193* (2013.01); *H03F 3/3011* (2013.01); H03F 1/301 (2013.01); H03F 1/302 (2013.01); H03F 1/307 (2013.01); H03F 3/3066 (2013.01); H03F 3/3076 (2013.01); H03F 2200/18 (2013.01); H03F 2200/294 (2013.01); H03F 2200/318 (2013.01); H03F 2200/451 (2013.01); H03F 2203/30084 (2013.01); H03F 2203/30117 (2013.01)

(58) Field of Classification Search
CPC ...................................................... H03F 1/303
USPC .................................. 330/296, 51, 85, 285
See application file for complete search history.

(56) References Cited

U.S. PATENT DOCUMENTS

| | | | |
|---|---|---|---|
| 7,936,217 B2 * | 5/2011 | Deng ................... | H03F 1/0261 330/264 |
| 9,077,302 B2 * | 7/2015 | Wagner ................. | H03F 1/223 |

* cited by examiner

*Primary Examiner* — Khanh V Nguyen
*Assistant Examiner* — Khiem Nguyen
(74) *Attorney, Agent, or Firm* — Kirton McConkie; Evan R. Witt

(57) ABSTRACT

An inductor-less low noise amplifier (LNA) with high linearity is disclosed. The low noise amplifier includes: an input signal stage receiving an input signal; a first amplifier configured to receive the input signal, generate a first amplification signal by amplifying the received input signal, and output the generated first amplification signal, as a first output signal, to a first output terminal; a second amplifier configured to receive the input signal, generate a second amplification signal by amplifying the received input signal, and output the generated second amplification signal, as a second output signal, to a second output terminal; an output signal stage outputting a superimposition signal obtained by superimposing the first output signal and the second output signal; a first resistor feeding back the superimposition signal to the input signal stage; and a switch connecting/disconnecting between the input signal stage and the output signal stage.

16 Claims, 6 Drawing Sheets

HIGH LINEARITY INDUCTORLESS LNA

BACKGROUND OF THE INVENTION

Field of the Invention

The present invention relates to an inductor-less LNA (Low Noise Amplifier) with a blocking function which is used in a communication system.

Background of the Invention

This section is just to provide background information related to embodiments of the present invention but is not intended to explain conventional techniques related thereto.

As is known in the related art, ISDB-T (Integrated Service Digital Broadcasting Terrestrial) uses a UHF (Ultra High Frequency) frequency band (470 MHz to 707 MHz), ISDB-Tmm (Integrated Service Digital Broadcasting Terrestrial Mobile Multi-Media) uses a VHF (Very High Frequency) frequency band (170 MHz to 280 MHz), and ISDB-Tsb (Integrated Service Digital Broadcasting Terrestrial Sound Broadcasting) uses an LVHF (Low Very High Frequency) frequency band (90 MHz to 110 MHz). Among these, the ISDB-Tmm scheme has been devised for mobile broadcasting based on the ISDB-T scheme which is being currently used for terrestrial digital TV broadcasting. That is, the ISDB-Tmm scheme can offer a fused service for two media, i.e., communication and broadcasting having different properties.

In mobile tuner environments supporting the above-mentioned ISDB-T, ISDB-Tmm and ISDB-Tsb, a TV receiving chip and an antenna are relatively distant from each other. This may produce a line loss, which may result in increase in NF (Noise Figure) and hence deterioration of reception sensitivity.

In order to minimize such deterioration of reception sensitivity, there has been conventionally proposed a method for additionally using a small capacity low noise amplifier disposed immediately before the antenna to increase the reception sensitivity of the TV receiving chip against the line loss. However, recent use of an LTE (Long Term Evolution) band ranging from 700 MHz to 2.4 GHz for mobile phones deteriorates the performance of the ISDB-T of the UHF frequency band (470 MHz to 707 MHz). The reason for the performance deterioration will be described below with reference to FIG. 1.

FIG. 1 shows a channel environment of a conventional LNA.

Referring to FIG. 1, in a channel environment for a mobile TV tuner, a desired channel has less power, whereas ambient channels have more power. Therefore, in order to avoid such power unbalance, there is a need to increase the linearity of the LNA such that harmonic tones of the ambient channels have no effect on the desired channel.

If the LNA supports ISDB-Tmm, in general, two amplifiers are used to support a frequency band. An LNA may be used to support a UHF frequency band and a VHF frequency band in a wide range. However, in mobile environments, if a large input signal with jammer power occurs in a frequency band adjacent to the desired channel, an interference may occurs between signals of the desired channel. Therefore, there is need to reduce an interference between adjacent frequency bands. In addition, there is a need to reduce an interference between frequencies of FM signals used between a UHF frequency band and a VHF frequency band and an interference between UHF adjacent frequency bands such as CDMA (Code Division Multiple Access), LTE (Long Term Evolution) and the like.

SUMMARY OF THE INVENTION

Accordingly, it is an object of the present invention to provide an inductor-less low noise amplifier (LNA) with a first amplifier and a second amplifier, which is capable of making IC (Integrated Circuit) more compact and improving a noise figure (NF) by increasing trans-conductance of the LNA by reusing a current of the first amplifier in the second amplifier.

It is another object of the present invention to provide a low noise amplifier which is capable of achieving high linearity by cancelling the third-order trans-conductance of the first amplifier and the third-order trans-conductance of the second amplifier from each other in order to minimize a third-order intermodulation component.

According to one embodiment of the present invention, there is provided a low noise amplifier including: an input signal stage which receives an input signal; a first amplifier which has a first input terminal and a first output terminal and is configured to receive the input signal in the first input terminal, generate a first amplification signal by amplifying the received input signal, and output the generated first amplification signal, as a first output signal, to the first output terminal; a second amplifier which has a second input terminal and a second output terminal and is configured to receive the input signal in the second input terminal, generate a second amplification signal by amplifying the received input signal, and output the generated second amplification signal, as a second output signal, to the second output terminal; an output signal stage which receives the first output signal and the second output signal and outputs a superimposition signal obtained by superimposing the first output signal and the second output signal; a first resistor which feeds back the superimposition signal to the input signal stage; and a switch which connects/disconnects between the input signal stage and the output signal stage.

When the switch is switched off, the first amplifier and the second amplifier may be turned on to be operated in a high gain mode, and, when the switch is switched on, the first amplifier and the second amplifier may be turned off to be operated in a low gain mode.

The first amplifier may include a first current drawing-in terminal, a first input terminal and a first current drawing-out terminal and outputs the first output signal to the first current drawing-in terminal when the input signal is applied to the first input terminal. The second amplifier may include a second current drawing-in terminal, a second input terminal and a second current drawing-out terminal and outputs the second output signal to the second current drawing-out terminal when the input signal is applied to the second input terminal.

The first amplifier may be an NMOS (N-channel Metal Oxide Semiconductor) amplifier.

The second amplifier may be a PMOS (P-channel Metal Oxide Semiconductor) amplifier.

The low noise amplifier may further include: a third resistor which supplies a bias voltage to the first input terminal, wherein the third resistor has the resistance of 20 kΩ to 50 kΩ.

According to another embodiment of the present invention, there is provided a low noise amplifier including: an input signal stage which receives an input signal; a first capacitor which generates a first blocking signal by blocking a DC component contained in the input signal; a second capacitor which generates a second blocking signal by blocking a DC component contained in the input signal; a first transistor which has a first input terminal, a first current drawing-in terminal and a first current drawing-out terminal and is configured to receive the first blocking signal in the first input terminal, generate a first amplification signal by amplifying the received first blocking signal, and output the generated first amplification signal to the first current drawing-out terminal; a second transistor which has a second input terminal, a second current drawing-in terminal and a second current drawing-out terminal and is configured to receive the second blocking signal in the second input terminal, generate a second amplification signal by amplifying the received second blocking signal, and output the generated second amplification signal to the second current drawing-out terminal; an output signal stage which connects the first current drawing-in terminal and the second current drawing-out terminal and outputs a superimposition signal obtained by superimposing the first amplification signal and the second amplification signal; a first resistor which supplies a bias voltage to the second input terminal of the second transistor; and a fifth transistor which connects/disconnects between the input signal stage and the output signal stage.

The low noise amplifier may further include: a third transistor which has a third input terminal, a third current drawing-in terminal and a third current drawing-out terminal connected to the first current drawing-in terminal of the first transistor and is configured to output the first amplification signal to the third current drawing-in terminal; and a fourth transistor which has a fourth input terminal, a fourth current drawing-in terminal and a fourth current drawing-out terminal connected to the second current drawing-in terminal of the second transistor and is configured to output the second amplification signal to the fourth current drawing-in terminal.

The first capacitor and the second capacitor may protect the first input terminal and the second input terminal from ESD (Electrostatic Discharge), respectively.

The low noise amplifier may further include: a second resistor which supplies a bias voltage to an input terminal of the fifth transistor, wherein the second resistor has the resistance of 20 kΩ to 50 kΩ.

The low noise amplifier according to claim 8, further comprising: a third resistor which supplies a first bias voltage to the first input terminal, wherein the third resistor has the resistance of 20 kΩ to 50 kΩ.

The first resistor may have the resistance of 50Ω to 2 kΩ and provide real term impedance for impedance matching with the input signal stage.

When the fifth transistor is turned on, the low noise amplifier may operate in a low gain mode in which the input signal is transferred to the output signal stage.

When the low noise amplifier operates in the low gain mode, the third transistor and the fourth transistor may be switched such that the first current drawing-in terminal of the first transistor and the second current drawing-out terminal of the second transistor have high impedance.

The low noise amplifier may further include: a sixth transistor configured to set an initial voltage of a current drawing-in terminal of the fifth transistor to 0V when the low noise amplifier operates in the low gain mode; and a sixth resistor connected between the output signal stage and a current drawing-in terminal of the sixth transistor for impedance matching.

A fourth resistor and a fifth resistor may be connected between the third input terminal of the third transistor and the fourth input terminal of the fourth transistor; and, when fifth transistor is turned off, the low noise amplifier may operate in a high gain mode in which the input signal is amplified and output to the output signal stage, and, a bias voltage of the third input terminal of the third transistor and a bias voltage of the fourth input terminal of the fourth transistor may be varied such that the third transistor and the fourth transistor are always turned on.

According to embodiments of the present invention, it is possible to provide an inductor-less low noise amplifier (LNA) with a first amplifier and a second amplifier, which is capable of making IC (Integrated Circuit) more compact and improving a noise figure (NF) by increasing trans-conductance of the LNA by reusing a current of the first amplifier in the second amplifier.

In addition, it is possible to provide a low noise amplifier which is capable of achieving high linearity by cancelling the third-order trans-conductance of the first amplifier and the third-order trans-conductance of the second amplifier from each other in order to minimize a third-order intermodulation component.

DETAILED DESCRIPTION OF THE PREFERRED EMBODIMENT

Figure 1:
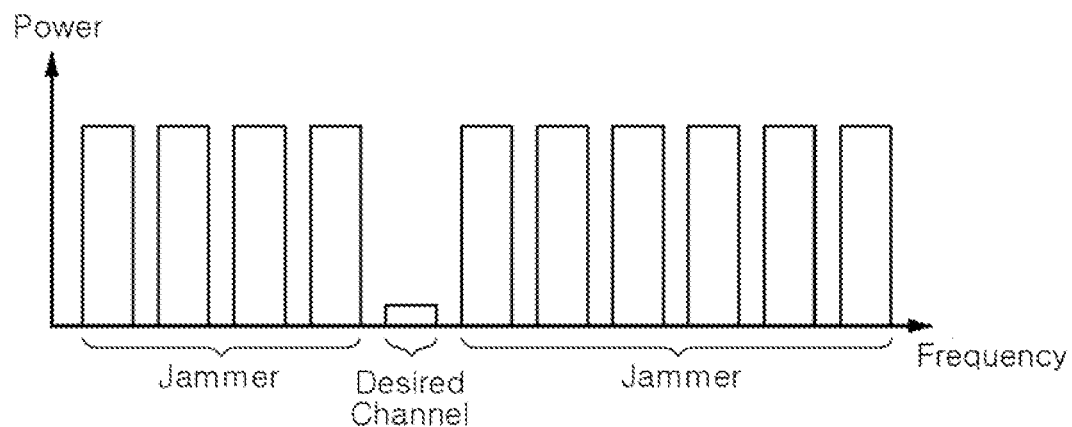
FIG. 1 shows a channel environment of a conventional LNA.

The above objects, features and advantages will become more clearly apparent from the following detailed description in conjunction with the accompanying drawings. Therefore, the technical ideas of the present invention can be easily understood and practiced by those skilled in the art. In the following detailed description of the present invention, concrete description on related functions or constructions will be omitted if it is deemed that the functions and/or constructions may unnecessarily obscure the gist of the present invention. Hereinafter, preferred embodiments of the present invention will be described in detail with reference to the accompanying drawings. Throughout the drawings, the same or similar elements are denoted by the same reference numerals.

Figure 2:
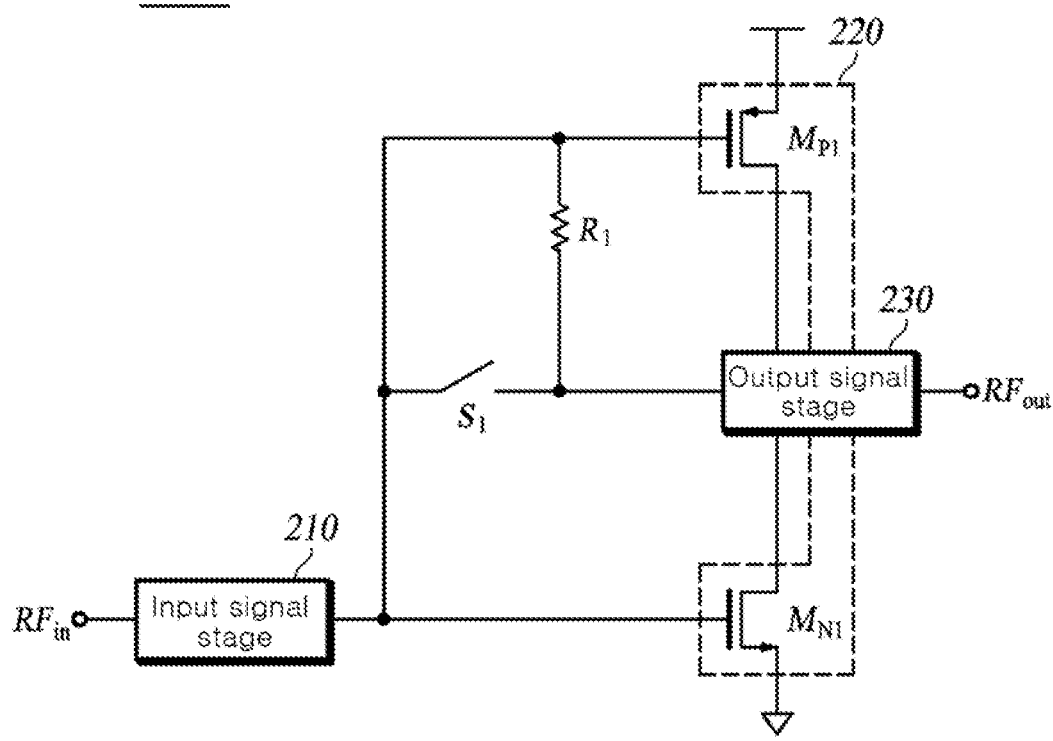
FIG. 2 shows a simplified circuit of an LNA according to an embodiment.

FIG. 2 shows a simplified circuit of a low noise amplifier (LNA) according to an embodiment.

Referring to FIG. 2, an LNA 200 includes an input signal stage 210, an LNA core 220, a switch $S_1$, a first resistor $R_1$ and an output signal stage 230. It is here noted that the elements included in the LNA 200 are not limited thereto.

Hereinafter, amplifiers $M_{N1}$ and $M_{P1}$ constituting the LNA core 220 according to this embodiment will be described on the basis of a bias current for convenience of description.

As an NMOS (N-channel Metal Oxide Semiconductor) amplifier, the first amplifier $M_{N1}$ includes a gate, a drain and a source. On the basis of the bias current, the 'source' is referred to as a 'first current drawing-in terminal,' the 'drain' is referred to as a 'first current drawing-out terminal,' and the 'gate' is referred to as a 'first input terminal.'

As a PMOS (P-channel Metal Oxide Semiconductor) amplifier, the second amplifier $M_{P1}$ includes a gate, a drain and a source. On the basis of the bias current, the 'source' is referred to as a 'second current drawing-out terminal,' the 'drain' is referred to as a 'second current drawing-in terminal,' and the 'gate' is referred to as a 'second input terminal.'

The gates of the first and second amplifiers $M_{N1}$ and $M_{P1}$ control a current flow between the sources and drains thereof. The drain refers to a terminal through which carriers supplied from the source pass through a channel region and are externally ejected. The source supplies carriers transporting a current. Here, the first input terminal of the first amplifier $M_{N1}$ and the second terminal of the second amplifier $M_{P1}$ are both connected to the input signal stage 210.

The input signal stage 210 receives a single input of an input signal $RF_{in}$ and applies signal having the same phase to the first input terminal of the first amplifier $M_{N1}$ and the first second terminal of the second amplifier $M_{P1}$, respectively.

When the switch $S_1$ is switched off, the LNA 200 operates in a high gain mode. In the high gain mode, the first amplifier $M_{N1}$ and the second amplifier $M_{P1}$ amplify the input signal $RF_{in}$. On the other hand, when the switch $S_1$ is switched on, the LNA 200 operates in a low gain mode. In the low gain mode, the input signal $RF_{in}$ is output to the output signal stage 230. That is, the LNA 200 has a unity gain.

The first resistor $R_1$ provides a bias voltage to the second amplifier $M_{P1}$ and feeds back an output signal $RF_{out}$ of the output signal stage 230 to the input signal stage 210 in order to improve linearity characteristics of the LNA 200. The first resistor $R_1$ has the resistance of 50Ω to 2 kΩ and provides real term impedance for impedance matching between an input signal source supplying the input signal $RF_{in}$ and the input signal stage 210 of the LNA 200.

The LNA core 220 includes the first amplifier $M_{N1}$ and the second amplifier $M_{P1}$. Elements included in the LNA core 220 are not necessarily limited thereto.

The first amplifier $M_{N1}$ uses a first transistor $M_{N1}$ as a CS (Common source) amplifier and the second amplifier $M_{P1}$ uses a second transistor $M_{P1}$ as a CS amplifier. The second transistor $M_{P1}$ operates as a load resistor of the first amplifier $M_{N1}$ and also operates as the second amplifier $M_{P1}$ by reusing a current of the first amplifier $M_{N1}$.

The LNA 200 may a CMOS (Complementary Metal Oxide Semiconductor) transistor. The trans-conductance $g_m$ of the CMOS transistor is expressed by the following equation 1

$$g_m = \sqrt{2 \cdot \mu_n \cdot C_{ox} \cdot I_d} \quad [\text{Eq. 1}]$$

Where, $\mu_n$ is a mobility of charges, Cox is a capacitance of a gate oxide, and $I_d$ is a drain current. According to Eq. 1, a higher trans-conductance requires a larger drain current. In one embodiment, the LNA 200 has an advantage of increasing the trans-conductance when the first amplifier $M_{N1}$ and the second amplifier $M_{P1}$ share a current. The trans-conductance $g_m$ of the LNA 200 is expressed by the following equation 2

$$g_m = g_{m1} + g_{m2} = \sqrt{2 \cdot \mu_n \cdot C_{ox} \cdot I_d} + \sqrt{2 \cdot \mu_n \cdot C_{ox} \cdot I_d} \quad [\text{Eq. 2}]$$

Where, $g_{m1}$ is the trans-conductance of the first amplifier $M_{N1}$ and $g_{m2}$ is the trans-conductance of the second amplifier $M_{P1}$.

As can be seen from Eq. 2, when the first amplifier $M_{N1}$ and the second amplifier $M_{P1}$ share the same current, the trans-conductance of the LNA 200 can be increased without flowing an additional current. When each of the first transistor $M_{N1}$ and the second transistor $M_{P1}$ operates in a saturation region, the largest small signal voltage gain can be obtained. The gain of the LNA 200 is expressed by the following equation 3.

$$A_v = 1 \cdot (g_{m1} + g_{m2}) \cdot R_1 \quad [\text{Eq. 3}]$$

Where, $g_{m1}$ is the trans-conductance of the first transistor $M_{N1}$, $g_{m2}$ is the trans-conductance of the second transistor $M_{P1}$, and $R_1$ is a feedback resistor. In one embodiment, the LNA 200 can increase its gain with increase in its trans-conductance without flowing an additional current, like Eq. 2.

The noise figure (NF) of the LNA 200 according to one embodiment can be simply expressed by the following equation 4.

$$NF = 1 + \frac{1}{1 + A_v} \quad [\text{Eq. 4}]$$

Where, Av is the gain of the LNA 200. According to Eq. 4, a larger gain provides a smaller NF. The LNA 200 can improve the NF characteristics by increasing a voltage gain without increasing the current $I_d$, according to Eq. 2 and Eq. 3.

The LNA 200 employs a method of reducing third-order intermodulation in order to high linearity. The method of reducing third-order intermodulation is to reduce the third-order harmonic component of harmonics of an amplifier signal.

A drain current $i_{ds}$ of CS (Common Source) MOSFET (Metal Oxide Silicon Field Effect Transistor) can be expressed as Taylor series by the following equation 5.

$$i_{ds} = I_{dc} + g_m v_{gs} + \frac{g'_m}{2!} v_{gs}^2 + \frac{g''_m}{3!} v_{gs}^3 \quad [\text{Eq. 5}]$$

Where, $V_{GS}$ is a small signal gate-source voltage, $g_m$ is the first-order trans-conductance, $g'_m$ is the second-order trans-conductance, and $g''_m$ is the third-order trans-conductance.

The LNA 200 according to one embodiment reduces the third-order trans-conductance in order to reduce the third-order intermodulation component in Eq. 5. The LNA 200 can minimize the third-order trans-conductance by cancelling the third-order trans-conductance of the first amplifier $M_{N1}$ and the third-order trans-conductance of the second amplifier $M_{P1}$ from each other. Accordingly, the LNA 200 can increase the linearity for an input signal by reducing the third-order harmonic component.

Figure 3:
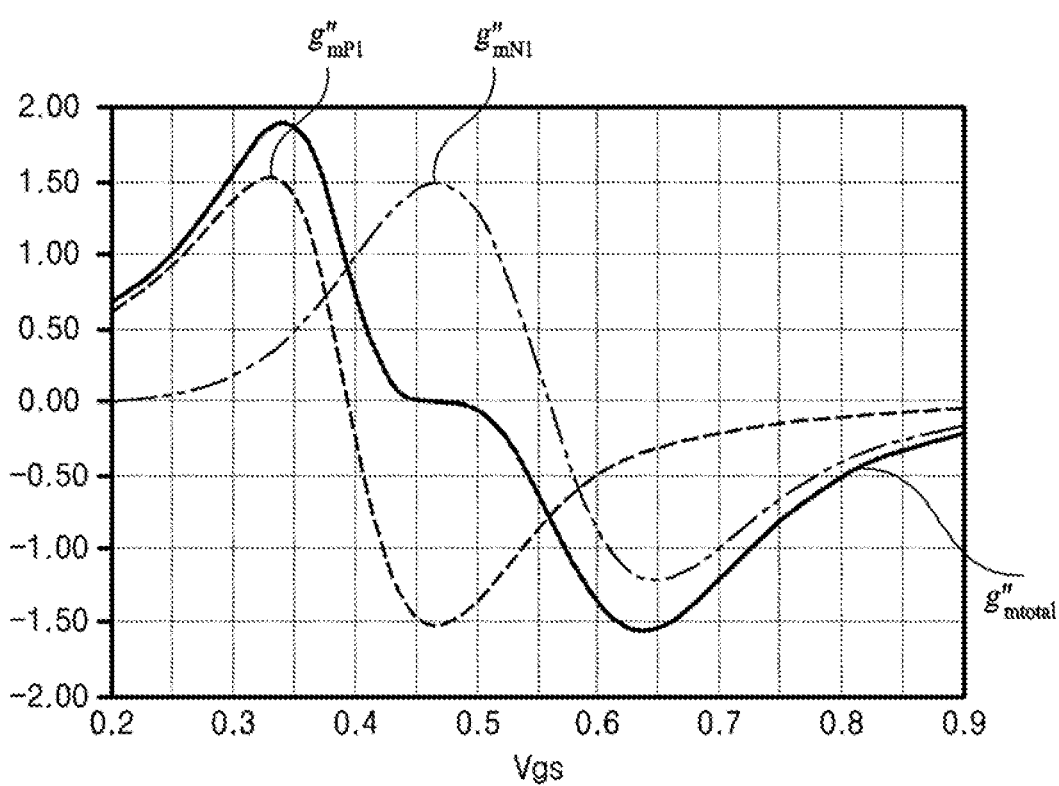
FIG. 3 shows simulation waveforms of the third-order trans-conductance shown in FIG. 2.

FIG. 3 shows simulation waveforms of the third-order trans-conductance shown in FIG. 2.

The LNA 200 increases a range of an input signal voltage by reducing the third-order harmonic component of harmonics of the input signal. As shown in FIG. 3, a two-dot chain line represents the third-order trans-conductance $g''_{mN1}$ due to the first transistor $M_{N1}$ as the first amplifier, a dotted line represents the third-order trans-conductance $g''_{mP1}$ due to the second transistor $M_{P1}$ as the second amplifier, and a solid line represents the total third-order trans-conductance. It can be seen from FIG. 3 that the third-order trans-conductance of the first amplifier and the third-order trans-conductance of the second amplifier are cancelled from each other in a range of $V_{GS}$ from about 0.4V to about 0.55V. Accordingly, in one embodiment, the LNA 200 provides high linearity by cancelling the third-order trans-conductance of the first amplifier $M_{N1}$ and the third-order trans-conductance of the second amplifier $M_{P1}$ from each other in order to minimize the third-order intermodulation component.

Figure 4A:
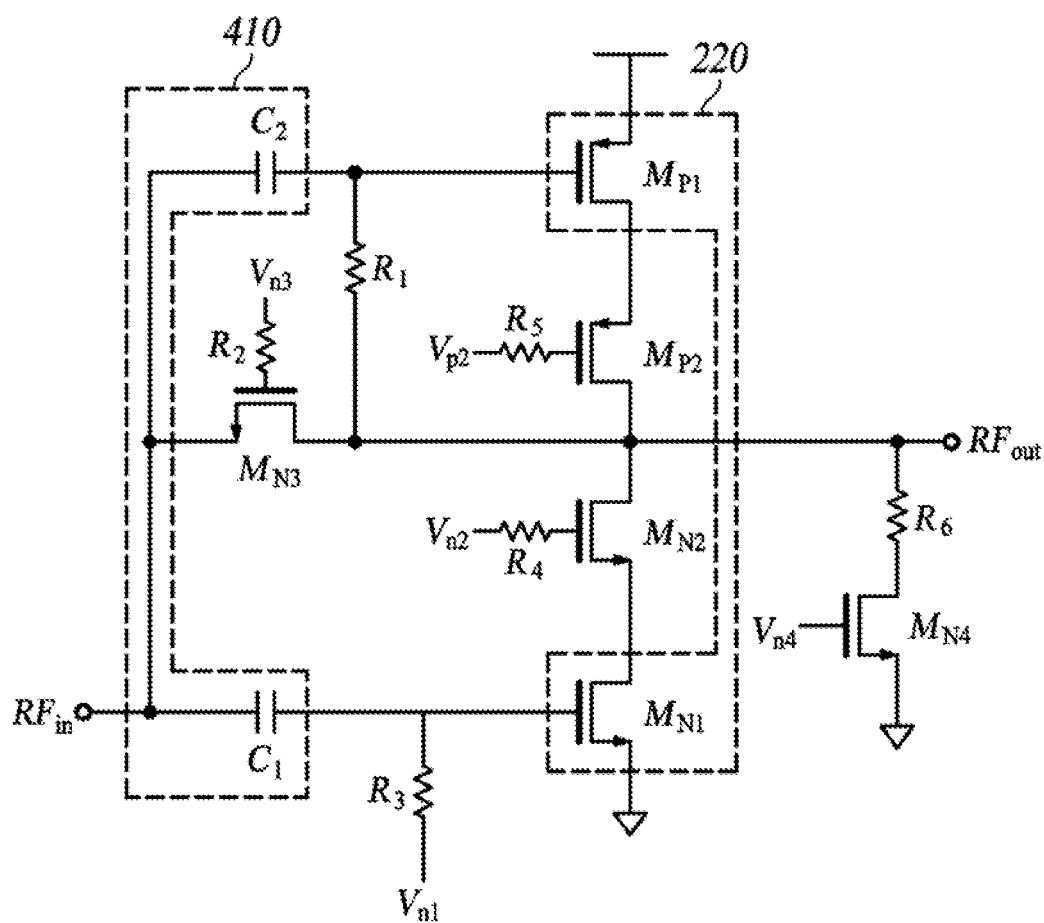
FIG. 4A is a detailed circuit diagram of an LNA according to this embodiment.

FIG. 4A is a detailed circuit diagram of an LNA according to this embodiment.

Referring to FIG. 4A, an LNA 400 includes a capacitor part 410, an LNA core part 220, a first resistor $R_1$ and a fifth transistor $M_{N3}$ acting as a first switch. When the fifth transistor $M_{N3}$ is turned off, the LNA 400 operates in a high gain mode. In the high gain mode, the first transistor $M_{N1}$ and the second transistor $M_{P1}$ amplify an input signal $RF_{in}$. On the other hand, when the fifth transistor $M_{N3}$ is turned on, the LNA 400 operates in a low gain mode. In the low gain mode, the input signal $RF_{in}$ is output as an output signal $RF_{out}$. That is, the LNA 400 has a unity gain.

The capacitor part 410 includes a first capacitor $C_1$ which receives the input signal $RF_{in}$ and generates a first blocking signal by blocking a DC component contained in the input signal $RF_{in}$, and a second capacitor $C_2$ which receives the input signal and generates a second blocking signal by blocking a DC component contained in the input signal. The capacitor part 410 is used to improve the performance of ESD (Electro Static Discharge). More specifically, the capacitor part 410 is used to protect a first drawing-in terminal of the first transistor $M_{N1}$ and a second drawing-in terminal of the second transistor $M_{P1}$ from ESD.

The LNA core part 220 includes the first transistor $M_{N1}$ and the second transistor $M_{P1}$. The first transistor $M_{N1}$ has a first current drawing-in terminal, a first input terminal and a first current drawing-out terminal. When the first blocking signal is applied to the first input terminal, the first transistor $M_{N1}$ generates a first output signal, which is obtained by amplifying the first blocking signal, and outputs the first output signal, as a first amplification signal, to the first current drawing-out terminal. The second transistor $M_{P1}$ has a second current drawing-in terminal, a second input stage and a second current drawing-out terminal. When the second blocking signal is applied to the second input terminal, the second transistor $M_{P1}$ generates a second output signal, which is obtained by amplifying the second blocking signal, and outputs the second output signal, as a second amplification signal, to the second current drawing-out terminal.

A first bias voltage $V_{n1}$ is applied to the first input terminal of the first transistor $M_{N1}$ via a third resistor $R_3$ which is set to have high impedance (e.g., 20 kΩ to 50 kΩ) so as to have no effect on impedance matching.

The first resistor $R_1$ provides a bias voltage to the second amplifier $M_{P1}$ and feeds back the output signal $RF_{out}$ to the input signal stage in order to improve linearity characteristics of the LNA 400. The first resistor $R_1$ has the resistance of 50Ω to 2 kΩ and provides real term impedance for impedance matching with an input signal source supplying the input signal $RF_{in}$.

The LNA 400 further includes a third transistor $M_{N2}$ and a fourth transistor $M_{P2}$. The third transistor $M_{N2}$ has a third current drawing-out terminal connected to the current drawing-in terminal of the first transistor $M_{N1}$, and a third current drawing-in terminal to which the first amplification signal is output. The fourth transistor $M_{P2}$ has a fourth current drawing-in terminal connected to the current drawing-out terminal of the second transistor $M_{P1}$, and a fourth current drawing-out terminal to which the second amplification signal is output. A superimposition $RF_{out}$ of the first amplification signal and the second amplification signal is output to a node between the third current drawing-in terminal of the third transistor $M_{N2}$ and the fourth current drawing-out terminal of the fourth transistor $M_{P2}$.

A second bias voltage $V_{n2}$ is applied to the third input terminal of the third transistor $M_{N2}$ via a fourth resistor $R_4$ which is set to have high impedance (e.g., 20 kΩ to 50 kΩ).

A fifth bias voltage $V_{p2}$ is applied to a fourth input terminal of the fourth transistor $M_{P2}$ via a fifth resistor $R_5$ which is set to have high impedance (e.g., 20 kΩ to 50 kΩ).

The fifth transistor $M_{N3}$ acts as a switch. A third bias voltage $V_{n3}$ is applied to a fifth input terminal of the fifth transistor $M_{N3}$ via a second resistor $R_2$ which is set to have high impedance (e.g., 20kΩ to 50kΩ).

Figure 4B:
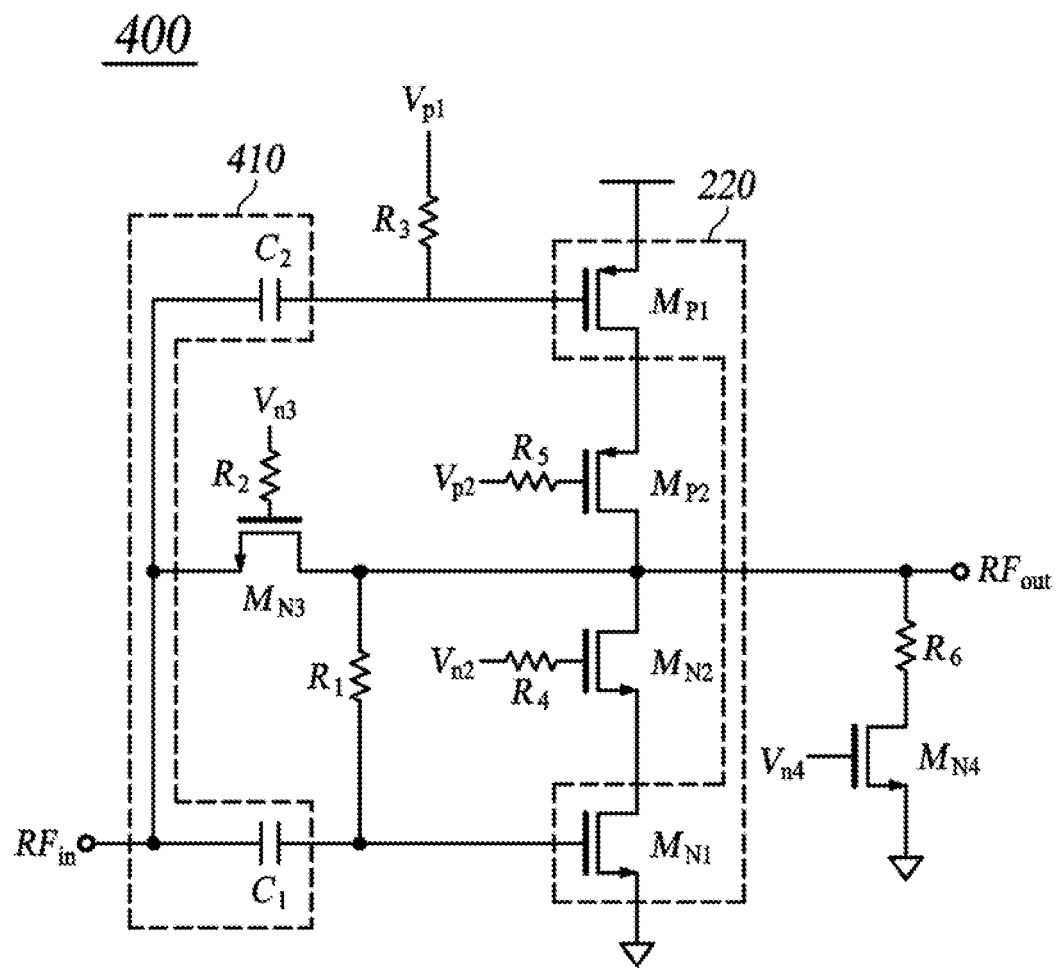
FIG. 4B is a detailed circuit diagram of an LNA according to another embodiment of the present invention.

The fifth transistor $M_{N3}$ is connected between the input signal stage and the output signal stage, as shown in FIGS. 4A and 4B, or may also be connected between one end of the first capacitor $C_1$ and one end of the third resistor $R_3$ or between one end of the second capacitor $C_2$ and one end of the first resistor $R_1$.

When the fifth transistor $M_{N3}$ is turned off, the LNA 400 operates in a high gain mode in which the first transistor $M_{N1}$ and the second transistor $M_{P1}$ amplify the input signal $RF_{in}$ in a saturation region. On the other hand, when the fifth transistor $M_{N3}$ is turned on, the LNA 400 operates in a low gain mode in which the first transistor $M_{N1}$ and the second transistor $M_{P1}$ are cut off. That is, the LNA 400 has a unity gain. The third bias voltage $V_{n3}$ is applied to the fifth input terminal of the fifth transistor $M_{N3}$ via the second resistor $R_2$ which is set to have high impedance (e.g., 20kΩ to 50kΩ) in order to improve linearity of the LNA 400 in the low gain mode.

When the fifth transistor $M_{N3}$ is turned on, a sixth transistor $M_{N4}$ is used to set an initial voltage of a fifth current drawing-in terminal of the fifth transistor $M_{N3}$ to 0V. A fourth bias voltage $V_{n4}$ is applied to a sixth input terminal of the sixth transistor $M_{N4}$. A sixth resistor $R_6$ is set to have high impedance (e.g., 20kΩ to 50kΩ) so as to have no effect on impedance matching in the low gain mode.

FIG. 4B is a detailed circuit diagram of an LNA according to another embodiment of the present invention.

An LNA 400 of FIG. 4B has basically the same configuration as that of FIG. 4A, which will not be explained for the purpose of brevity of description, except that the first resistor $R_1$ is connected between the output terminal and the first input terminal of the first transistor $M_{N1}$ and the first bias voltage Vp1 is coupled to the second input terminal of the second transistor $M_{P1}$ via the third resistor $R_3$.

Hereinafter, the operation of the LNA 400 in a high gain mode and a low gain mode will be described with reference to FIGS. 5 and 6.

Figure 5:
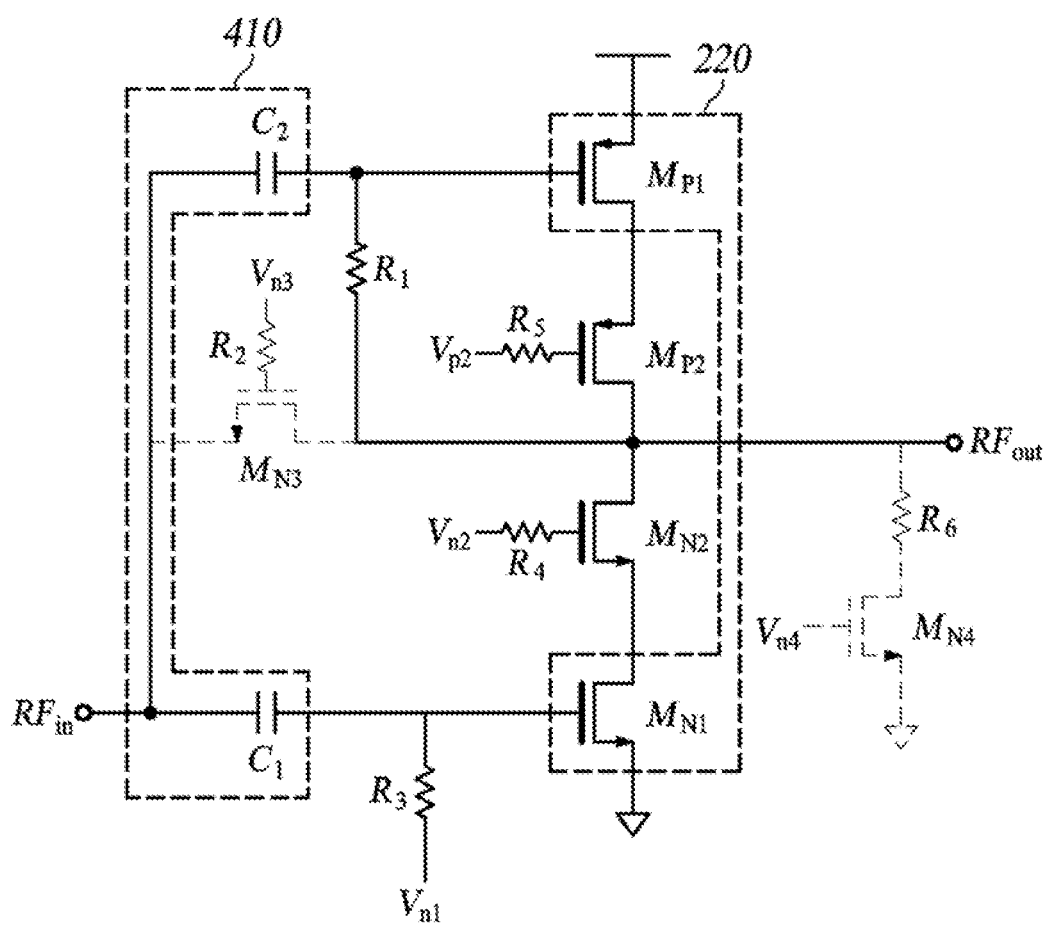
FIG. 5 is a circuit diagram of an LNA operating in a high gain mode.

FIG. 5 is a circuit diagram of the LNA 400 operating in a high gain mode.

When the fifth transistor $M_{N3}$ is turned off, all of the first transistor $M_{N1}$, the second transistor $M_{P1}$, the third transistor $M_{N2}$ and the fourth transistor $M_{P2}$ in the LNA 400 operate in a saturation region. The LNA 400 operates in the high gain mode in which the input signal $RF_{in}$ is amplified and the output signal $RF_{out}$ is output. The first bias voltage $V_{n1}$, the second bias voltage $V_{n2}$ and the fifth bias voltage $V_{p2}$ are applied to the first input terminal of the first transistor $M_{N1}$, the third input terminal of the third transistor $M_{N2}$ and the fourth input terminal of the fourth transistor $M_{P2}$, respectively, such that all of the first transistor $M_{N1}$, the second transistor $M_{P1}$ the third transistor $M_{N2}$ and the fourth transistor $M_{P2}$ operate in the saturation region in the high gain mode. As the output signal $RF_{out}$, a self-bias voltage is applied to the second input terminal of the second transistor $M_{P1}$.

The capacitor part 410 includes the first capacitor $C_1$ and the second capacitor $C_2$. The first capacitor $C_1$ receives the input signal $RF_{in}$, generates a blocking signal by blocking a DC component contained in the input signal $RF_{in}$, and applies the blocking signal to the first input terminal of the first transistor $M_{N1}$. The second capacitor $C_2$ receives the input signal $RF_{in}$, generates a blocking signal by blocking a DC component contained in the input signal $RF_{in}$, and applies the blocking signal to the second input terminal of the second transistor $M_{P1}$. The first capacitor $C_1$ and the second capacitor $C_2$ are used to improve the performance of ESD. More specifically, these capacitors $C_1$ and $C_2$ are used to protect the first drawing-in terminal of the first transistor $M_{N1}$ and the second drawing-in terminal of the second transistor $M_{P1}$ from ESD.

The fifth transistor $M_{N3}$ and the sixth transistor $M_{N4}$ operate in a cut-off region so as to have no effect on the performance of the LNA 400 in the high gain mode.

The first bias voltage $V_{n1}$ is applied to the first input terminal of the first transistor $M_{N1}$. The third resistor $R_3$ is set to have high impedance (e.g., 20kΩ to 50kΩ) so as to have no effect on impedance matching to supply the input signal $RF_{in}$.

The first resistor $R_1$ provides a bias voltage to the second input terminal of the second amplifier $M_{P1}$ and feeds back the output signal $RF_{out}$ to the input signal stage in order to improve linearity characteristics of the LNA 400. The first resistor $R_1$ has the resistance of 50Ω to 2kΩ and provides real term impedance for impedance matching with the input signal source supplying the input signal $RF_{in}$.

When the LNA 400 operates in the low gain mode, the third transistor $M_{N2}$ and the fourth transistor $M_{P2}$ act as switches to provide high impedance to the first transistor $M_{N1}$ and the second transistor $M_{P1}$. The linearity of the LNA 400 may be deteriorated due to the third transistor $M_{N2}$ and the fourth transistor $M_{P2}$. In order to avoid such deterioration of linearity, the fourth resistor $R_4$ and the fifth resistor $R_5$ are set to high impedance such that voltages of the third and fourth input terminals of the third and fourth transistors $M_{N2}$ and $M_{P2}$ follow voltages of the third and fourth current drawing-in terminals of the third and fourth transistors $M_{N2}$ and $M_{P2}$, respectively. A method of improving the linearity by using the high impedance for the third and fourth input terminals of the third and fourth transistors $M_{N2}$ and $M_{P2}$ is to use a parasitic capacitance $C_{gs}$ such that the third transistor $M_{N2}$ and the fourth transistor $M_{P2}$ are always operated in a saturation region so that an input terminal voltage can follow the large input signal $RF_{in}$, thereby preventing the third transistor $M_{N2}$ and the fourth transistor $M_{P2}$ from instantaneously escaping into a linear region or a cut-off region.

Figure 6:
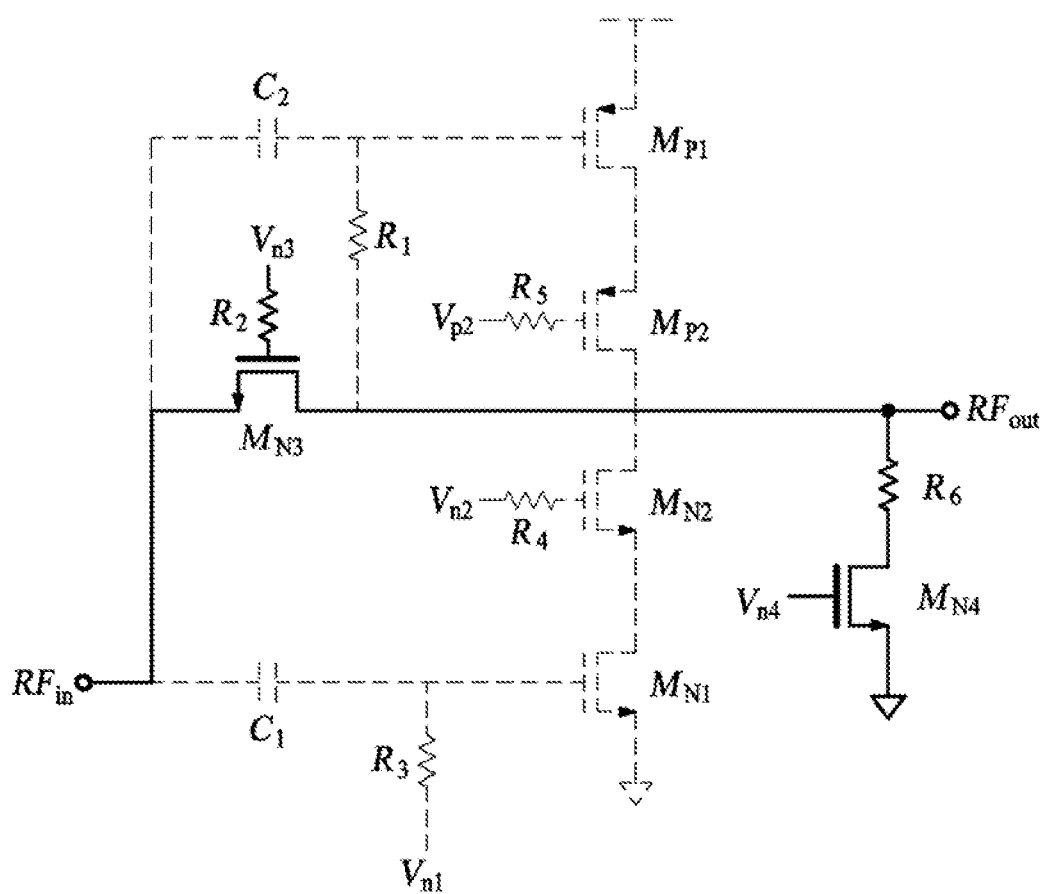
FIG. 6 is a circuit diagram of an LNA operating in a low gain mode.

FIG. 6 is a circuit diagram of the LNA 400 operating in a low gain mode.

When the fifth transistor $M_{N3}$ is turned on, all of the first transistor $M_{N1}$, the second transistor $M_{P1}$, the third transistor $M_{N2}$ and the fourth transistor $M_{P2}$ in the LNA 400 of FIG. 6 operate in a cut-off region. The LNA 400 operates in the low gain mode in which the input signal $RF_{in}$ is output as the output signal $RF_{out}$ with a unity gain. The third bias voltage $V_{n3}$ and the fourth bias voltage $V_{n4}$ are applied to the fifth input terminal of the fifth transistor $M_{N3}$ and the sixth input terminal of the sixth transistor $M_{N4}$, respectively, such that all of the fifth transistor $M_{N3}$ and the sixth transistor $M_{N4}$ operate as switches in the low gain mode. The third bias voltage $V_{n3}$ is applied to the fifth input terminal of the fifth transistor $M_{N3}$ via the second resistor $R_2$ so that the fifth transistor $M_{N3}$ can be operated as a switch. The second resistor $R_2$ is set to have high impedance (e.g., 20kΩ to 50kΩ) in order to improve linearity of the LNA 400 in the low gain mode.

When the fifth transistor $M_{N3}$ is turned on, the sixth transistor $M_{N4}$ is used to set an initial voltage of the fifth current drawing-in terminal of the fifth transistor $M_{N3}$ to 0V. The fourth bias voltage $V_{64}$ is applied to the sixth input terminal of the sixth transistor $M_{N4}$. The sixth resistor $R_6$ is set to have high impedance (e.g., 20kΩ to 50kΩ) so as to have no effect on impedance matching in the low gain mode.

While the present invention has been particularly shown and described with reference to exemplary embodiments thereof, it will be understood by those skilled in the art that various changes in form and details may be made therein without departing from the spirit and scope of the present invention. The exemplary embodiments are provided for the purpose of illustrating the invention, not in a limitative sense. Thus, it is intended that the present invention covers the modifications and variations of this invention provided they come within the scope of the appended claims and their equivalents.

What is claimed is:

1. A low noise amplifier comprising:
   an input signal stage which receives an input signal;
   a first amplifier which has a first input terminal and a first output terminal and is configured to receive the input signal in the first input terminal, generate a first amplification signal by amplifying the received input signal, and output the generated first amplification signal, as a first output signal, to the first output terminal;
   a second amplifier which has a second input terminal and a second output terminal and is configured to receive the input signal in the second input terminal, generate a second amplification signal by amplifying the received input signal, and output the generated second amplification signal, as a second output signal, to the second output terminal;
   an output signal stage which receives the first output signal and the second output signal and outputs a superimposition signal obtained by superimposing the first output signal and the second output signal;
   a first resistor which feeds back the superimposition signal to the input signal stage; and
   a switch connecting between the input signal stage and the output signal stage and configured to be switched on or off,
   wherein when the switch is switched off, the first amplifier and the second amplifier are turned on to be operated in a high gain mode, and
   wherein when the switch is switched on, the first amplifier and the second amplifier are turned off to be operated in a low gain mode.

2. The low noise amplifier according to claim 1, wherein the first amplifier includes a first current drawing-in terminal, the first input terminal and a first current drawing-out terminal and outputs the first output signal to the first current drawing-in terminal when the input signal is applied to the first input terminal.

3. The low noise amplifier according to claim 1, wherein the second amplifier includes a second current drawing-in terminal, the second input terminal and a second current drawing-out terminal and outputs the second output signal to the second current drawing-out terminal when the input signal is applied to the second input terminal.

4. The low noise amplifier according to claim 2, wherein the first amplifier is an NMOS (N-channel Metal Oxide Semiconductor) amplifier.

5. The low noise amplifier according to claim 3, wherein the second amplifier is a PMOS (P-channel Metal Oxide Semiconductor) amplifier.

6. The low noise amplifier according to claim 1, further comprising: a second resistor which supplies a bias voltage to the first input terminal, wherein the second resistor has the resistance of 20 k$\Omega$ to 50 k$\Omega$.

7. A low noise amplifier comprising:
an input signal stage which receives an input signal;
a first capacitor which generates a first blocking signal by blocking a DC component contained in the input signal;
a second capacitor which generates a second blocking signal by blocking a DC component contained in the input signal;
a first transistor which has a first input terminal, a first current drawing-in terminal and a first current drawing-out terminal and is configured to receive the first blocking signal in the first input terminal, generate a first amplification signal by amplifying the received first blocking signal, and output the generated first amplification signal to the first current drawing-out terminal;
a second transistor which has a second input terminal, a second current drawing-in terminal and a second current drawing-out terminal and is configured to receive the second blocking signal in the second input terminal, generate a second amplification signal by amplifying the received second blocking signal, and output the generated second amplification signal to the second current drawing-out terminal;
an output signal stage which connects the first current drawing-in terminal and the second current drawing-out terminal and outputs a superimposition signal obtained by superimposing the first amplification signal and the second amplification signal;
a first resistor which supplies a bias voltage to the second input terminal of the second transistor; and
a fifth transistor connecting between the input signal stage and the output signal stage and configured to be switched on or off.

8. The low noise amplifier according to claim 7, further comprising:
a third transistor which has a third input terminal, a third current drawing-in terminal and a third current drawing-out terminal connected to the first current drawing-in terminal of the first transistor and is configured to output the first amplification signal to the third current drawing-in terminal; and
a fourth transistor which has a fourth input terminal, a fourth current drawing-in terminal and a fourth current drawing-out terminal connected to the second current drawing-in terminal of the second transistor and is configured to output the second amplification signal to the fourth current drawing-in terminal.

9. The low noise amplifier according to claim 7, wherein the first capacitor and the second capacitor protect the first input terminal and the second input terminal from ESD (Electrostatic Discharge), respectively.

10. The low noise amplifier according to claim 7, further comprising: a second resistor which supplies a bias voltage to an input terminal of the fifth transistor, wherein the second resistor has the resistance of 20 k$\Omega$ to 50 k$\Omega$.

11. The low noise amplifier according to claim 7, further comprising: a third resistor which supplies a first bias voltage to the first input terminal, wherein the third resistor has the resistance of 20 k$\Omega$ to 50 k$\Omega$.

12. The low noise amplifier according to claim 7, wherein the first resistor has the resistance of 50$\Omega$ to 2 k$\Omega$ and provides real term impedance for impedance matching with the input signal stage.

13. The low noise amplifier according to claim 10, wherein, when the fifth transistor is turned on, the low noise amplifier operates in a low gain mode in which the input signal is transferred to the output signal stage.

14. The low noise amplifier according to claim 13, wherein, when the low noise amplifier operates in the low gain mode, the third transistor and the fourth transistor are switched such that the first current drawing-in terminal of the first transistor and the second current drawing-out terminal of the second transistor have high impedance.

15. The low noise amplifier according to claim 13, further comprising:
a sixth transistor configured to set an initial voltage of a current drawing-in terminal of the fifth transistor to 0V when the low noise amplifier operates in the low gain mode; and
a sixth resistor connected between the output signal stage and a current drawing-in terminal of the sixth transistor for impedance matching.

16. The low noise amplifier according to claim 7, wherein a fourth resistor and a fifth resistor are connected between the third input terminal of the third transistor and the fourth input terminal of the fourth transistor,
wherein, when fifth transistor is turned off, the low noise amplifier operates in a high gain mode in which the input signal is amplified and output to the output signal stage, and
wherein a bias voltage of the third input terminal of the third transistor and a bias voltage of the fourth input terminal of the fourth transistor are varied such that the third transistor and the fourth transistor are always turned on.

* * * * *